United States Patent [19]

Bany et al.

[11] Patent Number: 4,677,137
[45] Date of Patent: Jun. 30, 1987

[54] SUPPORTED PHOTOINITIATOR

[75] Inventors: Stephen W. Bany; Leigh E. Wood, both of St. Paul, Minn.

[73] Assignee: Minnesota Mining and Manufacturing Company, St. Paul, Minn.

[21] Appl. No.: 740,231

[22] Filed: May 31, 1985

[51] Int. Cl.$^4$ .......................... C08F 2/50; C08F 4/02; C08F 4/80; C08F 30/08; C08F 59/30
[52] U.S. Cl. ...................... 522/31; 502/150; 502/151; 502/152; 502/154; 502/155; 502/161; 502/162; 502/164; 502/522; 522/32; 522/64; 522/66; 522/72; 522/83; 522/99; 522/172; 526/279; 528/33
[58] Field of Search ............................. 522/31, 64–66, 522/32; 502/62, 155, 159, 522, 152, 150, 151, 154, 161, 162, 164

[56] References Cited

U.S. PATENT DOCUMENTS

| | | | |
|---|---|---|---|
| 3,949,016 | 4/1976 | Agouri | 525/94 |
| 4,067,843 | 1/1978 | Annis | 525/456 |
| 4,081,276 | 3/1978 | Crivello | 430/269 |
| 4,085,180 | 4/1978 | Stoffey | 524/558 |
| 4,150,988 | 4/1979 | Crivello | 96/35.1 |
| 4,161,478 | 7/1979 | Crivello | 260/327 |
| 4,220,580 | 9/1980 | Rowatt | 526/129 |
| 4,231,951 | 11/1980 | Smith et al. | 260/446 |
| 4,273,668 | 6/1981 | Crivello | 252/180 |
| 4,279,717 | 7/1981 | Eckberg | 204/159 |
| 4,322,320 | 3/1982 | Caprino | 524/34 |
| 4,341,658 | 7/1982 | Monnerat | 252/428 |
| 4,376,191 | 3/1983 | Geck | 526/102 |
| 4,456,711 | 6/1984 | Pietsch | 523/206 |

FOREIGN PATENT DOCUMENTS

| | | |
|---|---|---|
| 94914 | 11/1983 | European Pat. Off. . |
| 94915 | 11/1983 | European Pat. Off. . |
| 109851 | 5/1984 | European Pat. Off. . |

OTHER PUBLICATIONS

Lee and Neville, "Epoxy Resins", McGraw-Hill Book Company (1967), Appendix pp. 4-58 to 4-70.

*Primary Examiner*—John C. Bleutge
*Assistant Examiner*—A. H. Koeckert
*Attorney, Agent, or Firm*—Donald M. Sell; James A. Smith; Lorraine R. Sherman

[57] ABSTRACT

Supported initiators for the radiation-activated polymerization of cationically-polymerizable compounds, particularly epoxide group-containing compounds, are described. The supported initiators comprise a particulate carrier and a photocatalytic ionic salt. The supported initiators are especially useful for the polymerization of cationically-polymerizable compounds in which the ionic salt alone is not soluble.

24 Claims, No Drawings

SUPPORTED PHOTOINITIATOR

FIELD OF THE INVENTION

This invention relates to novel supported initiators of polymerization and to compositions containing these initiators. In another aspect a process for the polymerization of cationically-sensitive monomers using these polymerization initiators is disclosed. In a further aspect, the present invention also relates to articles containing the above-mentioned cured compositions, which compositions are useful as release coatings.

BACKGROUND ART

It has long been known that cationally-sensitive compounds, particularly epoxide group-containing monomers, can be polymerized by contacting them under polymerizing conditions with acid curing agents, e.g., Lewis acids (or Friedel Crafts catalysts), phenols, inorganic (or mineral) acids, or carboxylic acids. Under the broad term "Lewis acids" is included transition metal and metalloid halides such as $BF_3$, $PF_5$, $AsF_5$, $SbF_5$, $FeCl_3$, $SnCl_5$, $SbCl_5$, $BiCl_4$, $TiCl_4$, etc. and blocked Lewis acids such as boron trifluoride: monoethylamine (MEA), e.g., $BF_3MEA$, $PF_5MEA$, $AsF_5MEA$, and $SbF_5MEA$. These and other acid curing agents for polymerizing epoxide group-containing compounds are discussed in Lee and Neville, "Epoxy Resins," McGraw-Hill Book Company, pages 4–57 to 4–70 (1967).

More recently, photoinitators for the polymerization of cationically-sensitive compounds have been described. These photoinitiators are the aromatic onium salts of complex halogen acids, i.e., the aromatic ammonium, phosphonium, iodonium, sulfonium, or selenonium salts of Group VIA elements with a polyhalogen anion of a Group VA element, such as are disclosed in U.S. Pat. Nos. 4,161,478 (Crivello), 4,150,988 (Crivello), 4,231,951 (Smith), and 4,273,668 (Crivello).

U.S. Pat. No. 4,341,658 discloses a catalyst suitable for bringing about the reaction of a phenolic hydroxyl compound with vicinal epoxide group-containing compounds, the catalyst being the reaction product of a solid substrate containing a plurality of ion-exchangeable cations (i.e., the sodium salt of a sulfonated copolymer of styrene and divinylbenzene) with a polymer containing a plurality of quaternary onium cations associated with a reactive anion (i.e., poly(diallyl dimethyl ammonium chloride)). The reactive anion could also be provided by a polymeric phosphonium or sulfonium salt (see Col. 2, lines 1–3)). Such polymeric salts, not having a halogen containing complex anion would not be a photocatalyst for the polymerization of epoxide group-containing compounds.

U S. Pat. No. 4,279,717 (equivalent to U.K. Pat. No. 2,057,473) discloses a solventless silicone coating composition effective for rendering surfaces non-adherent to other surfaces and which will cure to a final nonadherent state upon brief exposure to ultraviolet radiation comprising an epoxy functional polydiorganosiloxane silicone fluid and an appropriate bisaryl iodonium salt. The appropriate bisaryl iodonium salts are those in which the aryl groups are substituted by "linear alkylate", i.e., dodecyl groups, the presence of which overcomes the failure of salts to dissolve in the silicone fluid and enable them to disperse throughout.

SUMMARY OF THE INVENTION

Briefly, the present invention provides an actinic radiation-activated initiator for the polymerization of cationically-sensitive monomers comprising one part of a dispersible particulate carrier having a surface area of from about 1 to 1000 square meters per gram and 0.005 to 5 parts by weight of a photocatalytic ionic salt of an onium or organometallic complex cation with a halogen-containing complex anion of a metal or metalloid. The actinic radiation-activated supported initiator overcomes the aforementioned problems of photocatalyst insolubility in epoxypolysiloxane.

In another aspect, the invention provides a solventless actinic radiation-curable composition comprising the supported initiator and a polymerizable epoxide group-containing compound, particularly an epoxypolysiloxane, the solventless compositions being curable in thicknesses up to about one centimeter by exposure to actinic radiation.

In a further aspect, the invention provides release coated substrates bearing a cured coating of the composition.

The supported initiator of the invention is particularly useful for the polymerization of cationically-polymerizable compounds in which the ionic salt alone is not soluble.

DETAILED DESCRIPTION OF THE INVENTION

In accordance with the present invention, any compound having a group subject to cationic polymerization, e.g., cationically-polymerizable organopolysiloxanes including cyclic organosilicones, vinyl ethers, epoxide group-containing compounds, cyclic ethers (oxiranes, oxetanes, and tetrahydrofuranes), lactones, styrene, and the like as is known in the art but particularly a compound having an epoxide, i.e., oxirane group,

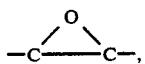

can be polymerized by exposure of the compound to actinic radiation while it is in contact with the supported initiator of the invention. It is indeed surprising that cationically-polymerizable organopolysiloxanes including polysiloxane group-containing epoxides and polysiloxane group-containing vinyl ethers in which neither component of the supported initiator is soluble can be polymerized.

The supported initiator can be prepared by dissolving the ionic salt of an onium or organometallic complex cation with halogen-containing complex of and anion of a metal or metalloid (referred to hereinafter as ionic salt) in a suitable solvent (common organic solvents such as methylene chloride, methanol, ethanol, acetone, nitromethane, benzene, etc.) and admixing the solution with an appropriate amount of a dispersible carrier material. On removal of solvent, an active form of the supported initiator is obtained.

By "dispersible particulate carrier" is meant a particulate material having a particle size of less than about 50 microns in its largest dimension, preferably in the range of 0.1 to 20 micrometers and more preferably 2 to 15 micrometers, and most preferably 2 to 5 micrometers, and is insoluble, i.e. essentially no measurable amount dissolves, in an epoxypolysiloxane, and when 10 parts by weight are stirred into 90 parts by weight of an epoxypolysiloxane, no more than 1 part by weight settles out in about 30 minutes.

The surface area of the particulate carrier of the supported initiator is not critical, but generally is about 1 to 1000 m²/g, and preferably between about 100–1000 m²/g. Illustrative of such carrier materials are silica, diatomaceous earth, clays (i.e., bentonite and attapulgus clay), starch (i.e., cornstarch), comminuted cellulose (i.e., cotton, wood), glass, and the like. Preferably, the carrier is transparent to actinic radiation. A preferred carrier is fumed silica, for example Cab-O-Sil ™ M5 (Cabot Corp., Tuscola, Ill.).

The photocatalytic ionic salt component of the supported initiator of the invention is selected from onium cations and organometallic complex cations with halogen containing complex anions of a metal or metalloid.

The photocatalytic ionic salts of an onium cation and a halogen-containing complex anion of a metal or metalloid are adducts of an aromatic organoatomic cation of a Periodic Group VA, VIA, or VIIA atom, recently given the notation of Groups 15, 16, and 17 in Chem. & Eng. News, Vol. 63, No. 5, 26 (Feb. 4, 1985), particularly phosphorous, antimony, sulfur, nitrogen, and iodine atoms, and an anion. The term "aromatic", as used in the description of the groups on the catalysts of the present invention means an aromatic ring which can be a hydrocarbon or a 5-, 6- or 7-membered heterocycle having ring atoms comprised of carbon and one or more atoms selected from S, O, or Se atoms so attached to the nominative atoms that the aromatic ring is at least as electron withdrawing as benzene For example,

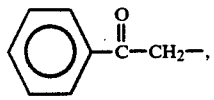

phenacyl, would be a useful aromatic group (being at least as electron withdrawing as phenyl), but benzyl,

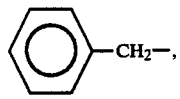

would not be useful because of instability of the compound which would impair storage stability. Representative aromatic rings are phenyl, naphthyl, thienyl, pyranyl, furanyl, and pyrazolyl, either substituted or unsubstituted. For purposes of convenience in describing these onium catalyst, the Group VA, VIA, or VIIA atom that provides the major nomenclature for the adduct (e.g, phosphorous in phosphonium, sulfur in sulfonium, iodine in iodonium, etc.) will be called the nominative atom.

A descriptive formula for the onium initiators (ionic salts of the onium type) of the present invention is

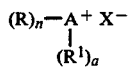

wherein

R is an aromatic group at least as electron withdrawing as benzene,

R¹ is an aromatic group that is the same as or is different from R or is a straight chain, branched, or cyclic alkyl or alkenyl group having 1 to 18 carbon atoms;

A is an atom of the periodic group VA, VIA, or n is a positive whole integer of at least 1 (preferably 2) up to the valence of A plus one;

a is zero or a positive whole integer of up to the valence of A (preferably A minus 1); provided that the sum of n plus a is equal to the valence of A plus one; and X is a halogen containing complex anion of a metal or metalloid.

These onium salts are already known in the art. For example, U.S. Pat. Nos. 4,026,705, 4,032,673, 4,069,056, 4,136,102 and 4,173,476, which are incorporated herein by reference, show the use of certain onium compounds as cationic polymerization catalysts for specific monomers such as organosilicon cyclics, vinyl resins, cyclic ethers, cyclic esters, cyclic sulfides, epoxy resins, phenolic resins, polyamines, lactones, styrene, urea/formaldehyde and melamine/formaldehyde resins.

At least one organo group, R, is aromatic; however, the other organo groups attached to the Group VA, VIA or VIIA nominative atom can be the same aromatic group or a substituted or unsubstituted alkyl, cycloalkyl, alkenyl, or cycloalkenyl group. The organo groups may also be directly attached one to another via a bond, a methylene group, a

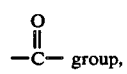

an —SO₂— group, an oxygen, or sulfur or the like. One or more of the organo groups can share two atoms in a condensed ring system.

Examples of suitable onium salts include, but are not limited to:

A. Onium Salts Having As Nominative Atom a Periodic Group Va Cation: diphenylmethylammonium tetrafluoroborate, tetraphenylphosphonium hexafluorophosphate, (4-bromophenyl)triphenylphosphonium hexafluorophosphate, tetraphenylarsonium tetrafluoroborate, tetraphenylbisammonium hexafluorophosphate, di(1-naphthyl)dimethylammonium tetrafluoroborate, tri-(3-thienyl)methylammonium tetrafluoroborate, and diphenacyldimethylammonium hexafluorophosphate.

Examples of these and other onium salts and their preparation are disclosed in Belgium Pat. No. 828,668.

B. Onium Salts Having as Nominative Atom a Periodic Group VIa Cation: triphenylsulfonium hexafluoroantimonate, 4-chlorophenyldiphenylsulfonium tetrafluoroborate, 4-cyanophenyldiphenylsulfonium hexafluorophosphate, triphenyltelluronium pentachlorobismuthate, and triphenylselenonium hexafluoroantimonate.

Examples of these and other onium salts having as nominative atom a Periodic Group VIA cation and their preparation are given in Belgium Pat. Nos. 828,670 and 833,472 and U.S. Pat. No. 4,256,825.

C. Onium Salts Having as Nominative Atom a Periodic Group VIIA Cation: diphenyliodonium hexafluorophosphate, 4-chlorophenylphenyliodonium hexafluoroantimonate, diphenyliodonium hexafluoroarsonate, 4-trifluoromethylphenylphenyliodonium tetrafluoroborate, di(4-methoxyphenyl)iodonium hexafluoroarsonate, 4-methylphenylphenyliodonium tetrafluoroborate, diphenylbromonium hexafluorophosphate, and 2,2'-diphenyliodonium hexafluorophosphate.

Examples of these and other halonium salts and their preparation are disclosed in Belgium Pat. No. 828,669 and U.S. Pat. No. 4,256,828.

The photocatalytic ionic salts having an organometallic complex cation and a halogen containing complex anion of a metal or metalloid are salts in which the cation is capable of adding an intermediate strength nucleophile (example of such a nucleophile is triphenylphosphine) or upon photolysis is capable of liberating at least one coordination site, the metal of the organometallic complex cation being selected from elements Periodic Groups IVB, VB, VIB, VIIB, and VIIIB, recently given the notation of Groups 4, 5, 6, 7, 8, 9, and 10 by Chem. & Eng. News, supra. Examples of such ionic salts and their preparation are disclosed in assignee's copending patent application U.S. Ser. No. 443,660, filed Nov. 22, 1982 which is incorporated herein by reference.

Although any of the photocatalytic ionic salts encompassed in the above definition are operable in the actinic radiation-activated initiators composition of the invention, preferred ionic salts have the formula:

$$[(L^9)(L^{10})M^p]^{+q}Y_n$$

wherein $M^p$ represents a metal selected from Cr, Mo, W, Mn, Re, Fe, and Co;

$L^9$ represents 1 or 2 ligands contributing $\pi$-electrons that can be the same or different ligand selected from substituted and unsubstituted $\eta^3$-allyl, $\eta^5$-cyclopentadienyl, and $\eta^7$-cycloheptatrienyl and 6-aromatic compounds selected from $\eta^6$-benzene and substituted 6-benzene compounds and compounds having 2 to 4 fused rings each capable of contributing 3 to 8 $\pi$-electrons to the valence shell of $M^p$;

$L^{10}$ represents none or 1 to 3 ligands contributing an even number of $\sigma$-electrons that can be the same or different ligand selected from carbon monoxide or nitrosonium;

with the proviso that the total electronic charge contriubuted to $M^p$ by $L^9$ and $L^{10}$ plus the ionic charge on metal $M^p$ results in a net residual positive charge of q to the complex, and q is an integer having a value of 1 or 2, the residual electrical charge of the complex cation;

Y is a halogen-containing complex anion selected from $AsF_6^-$, $SbF_6^-$ and $SbF_5OH^-$; and n is an integer having a value of 1 or 2, the number of complex anions required to neutralize the charge q on the complex cation.

Examples of salts of organometallic complex cations useful in the catalyst composition of the invention include the following:

($\eta^5$-cyclopentadienyl)tricarbonyliron(1+) hexfluorophosphate ($\eta^5$-cylopentadienyl)carbonylbis(triphenylstibine)iron(1+) hexafluorophosphate ($\eta^5$-methylcyclopentadienyl)dicarbonylnitrososylmanganese(1+) hexafluoroantimonate ($\eta^5$-cyclopentadienyl)tetracarbonylmolybdenum(1+) hexafluorophosphate ($\eta^5$-cyclopentadienyl)dicarbonylmethylisonitrileiron(1+) hexafluoroarsenate bis($\eta^6$-benzene)chromium(1+) hexafluoroantimonate bis($\eta^6$-hexamethylbenzene)cobalt(2+) hexafluoroantimonate bis($\eta^6$-mesitylene iron (2+) bis(hexafluoroantimonate).

Other examples of salts of organometallic complex cations useful in the catalyst are listed and exemplified in the above-mentioned patent application U.S. Ser. No. 443,660.

Cationically-polymerizable organopolysiloxanes in which neither component of the photoinitiator composition is soluble but which can be polymerized by the initiator composition of the invention are represented by the formula:

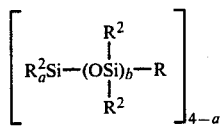

wherein each $R^2$ is independently a monovalent organic group having up to 18 carbon atoms, 37 hydrogen atoms, and 3 non-peroxidic oxygen atoms or $R^3$, at least one of $R^2$ being $R^3$ in which $R^3$ is a monovalent epoxy group-substituted or a vinyloxy group-substituted hydrocarbyl group, preferably $R^2$ is a linear alkyl group having 1 to 18 carbon atoms, a branched or cyclic alkyl group having 3 to 18 carbon atoms or phenyl, and most preferably $R^2$ is methyl;

a is zero, one, two, or three but preferably is two; and b is a number having an average value from 2 to about 1000, preferably 50 to 200, such that when considered with the value of a provides a number average molecular weight to the epoxy group-containing organopolysiloxane between 500 and 100,000, preferably 5,000 to 15,000.

Preferably, the organopolysiloxane has a low viscosity such as about 500 to 25,000 centistokes (5 to 250 cm²/sec).

Illustrative examples of the monovalent organic group $R^2$ in the above formula are alkyl groups such as butyl, isobutyl, tert-butyl, hexyl, octyl and octadecyl; aryl groups, such as phenyl, naphthyl and bisphenylyl; alkaryl groups such as tolyl and xylyl; aralkyl groups such as phenylmethyl, phenylpropyl and phenylhexyl; and cycloaliphatic groups such as cyclopentyl, cyclohexyl and 3-cyclohexylpropyl; and ether oxygen- or ester oxygen-containing groups such as ethoxypropyl, butoxybutyl, and ethoxycarbonylpropyl and the like.

The most preferred $R^2$ groups are alkyl of 1 to 4 carbon atoms or phenyl. The siloxane groups,

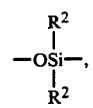

in the above formula for polyorganosiloxane are randomly arranged where $R^2$ varies from one group to the next.

The monovalent epoxy group-substituted hydrocarbyl group, $R^3$, contains at least one polymerizable epoxy group,

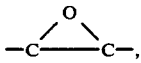

the remainder of the group being composed of carbon and hydrogen, and free of acetylenic unsaturation. In addition to the oxirane oxygen, the group can contain ether oxygen, —O—, carbonyl oxygen, i.e.,

or ester groups, i.e.

Illustrative examples of $R^3$ groups are:

[i.e., gamma-glycidoxypropyl]

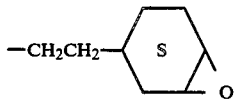

[i.e., beta-(3,4-epoxycyclohexyl)ethyl]

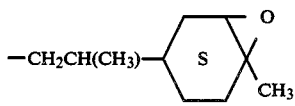

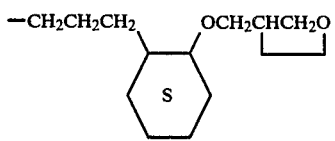

In the above epoxy-containing hydrocarbon groups the epoxy group is preferably located at the terminal position of the group, but it need not be a terminal group.

When $R^3$ is a monovalent vinyloxy group-substituted hydrocarbyl group, it contains at least one polymerizable vinyloxy group, $H_2C=CHO—$, the remainder of the group being composed of carbon and hydrogen atoms.

Due to the availability of starting materials, the ease of preparation and performance, the preferred epoxypolysiloxanes are those where $R^2$ is methyl, and $R^3$ is beta-(3,4-epoxycyclohexyl)ethyl or gamma-glycidoxypropyl.

The epoxypolysiloxanes can be prepared by many methods known in the art such as the chloroplatinic acid catalyzed addition reaction of hydrosiloxanes, containing the —SiH reactive group, with aliphatically unsaturated epoxy compounds, epoxidation of vinyl, alkyl or other unsaturated siloxanes and Grignard type reactions as for example described by E. P. Plueddemann and G Fanger, J. Am. Chem. Soc. 81, 2632–35 (1959). A convenient method is the hydrosiloxane addition reaction.

The amount of photocatalytic ionic salt in the radiation-activated supported initiator of the invention can range from about 0.005 to 5 parts by weight, preferably about 0.5 to 2 parts by weight, of photocatalytic ionic salt per part by weight of particulate carrier. In the polymerizable compositions of the invention, about 0.05 to 20 parts, preferably about 1.0 to 10 parts, of dispersible supported initiator can be used per 100 parts of cationically-polymerizable compound. The amount of supported initiator generally used will depend on the particular ionic salt, and particulate carrier present in the initiator and the particular epoxypolysilane used. At concentrations of catalyst composite above about 10 weight percent, the effect of the carrier becomes increasingly noticeable, e.g. in release coatings, the coatings exhibit decreasing release character. At concentrations of catalyst composite below about 5 weight percent the rate of polymerization becomes increasingly slower.

By the term "actinic radiation" is meant radiation having wavelengths in the 200 to 600 nm range, preferably 200 to 450 nm. Suitable sources include sunlight, carbon arcs, mercury vapor arcs, black light lamps, fluorescent lamps, argon and xenon glow lamps, electronic flash units and flood lamps. Depending on the concentration of catalyst composite, the particular epoxypolysiloxane, and the depth of the composition, exposures necessary to polymerize (which term includes crosslink and cure) the composition ranges from about 1 second or less to about 10 minutes or longer. Where the activating radiation is above about 400 nm, it is desirable to include in the photoinitiator composite a radiation sensitizer such as 1,3-diphenylisobenzofuran or 1,3-diphenyl-2-pyrazoline. Other useful sensitizers are disclosed in U.S. Pat. No. 4,250,053.

Substrates which may be coated with the crosslinkable compositions of the invention include organic substrates of wood, fiberboard, particle board, paper and cardboard; synthetic and natural polymers such as polyolefins, polyesters, polyamides, cured phenolics, ureaaldehyde resins, poly(vinyl halides), polyacrylates, polyurethanes, proteins, rubber; inorganic substrates such as iron, stainless steel, copper, brass, bronze, aluminum, titanium, nickel, zinc, and alloys. Particularly useful substrates are silicated aluminum and the polyesters such as polyethyleneterephthalate and poly(vinyl chloride).

The solventless actinic radiation-curable compositions of the invention are particularly suitable for preparing release liners of use with adhesive roll and sheet materials. For this use, a substrate of paper or a film of polymer such as, for example, polyester, polyamide, polyolefin, etc. is used. Where needed, primers, known in the art, such as 2-(3,4-epoxycyclohexyl)ethyltrimethoxysilane, may be used to improve adherence of the radiation-cured composition to the substrate without effecting the release performance of the epoxypolysiloxane coating.

In the following examples, evaluation of release coatings prepared using the photoinitiator composite of the invention was done by the following tests:

Release value

A standard pressure-sensitive adhesive tape having an acrylic pressure-sensitive adhesive, i.e., a 95.5:4.5 isooctyl acrylate: acrylic acid copolymer, as described in U.S. Pat. No. Re. 24,906, was pressed against the surface of a release coated substrate using two passes of a 2 Kg rubber roller to produce a laminate. The laminate was cut into 2.5×25 cm strips and attached, substrate side down, to a smooth stainless steel panel. The release value is the force, in grams, required to pull the pressure-sensitive adhesive tape with adhesive adhered thereto away from the release coated substrate at an angle of 180° and a pulling speed of 30 cm/min.

Heat Aged Release Value

A laminate of standard pressure-sensitive adhesive tape and release coated substrate was prepared as described above and heated in an oven at 70° C. for 20 hours. After this time, the laminate was removed from the oven, allowed to cool for at least 10 minutes in a room at 23°±0.2° C. and 50±2% R.H. and within 2 hours after removal from the oven, the force required to pull the pressuresensitive tape with adhesive adhered thereto away from the release coated substrate was measured as described in the above test.

Readhesion Test

The pressure-sensitive tape, as removed from the release-coated substrate, was pressed to the surface of a bright annealed stainless steel panel using two passes of a 2 Kg rubber roller. The readhesion efficiency is the quotient of the force, in grams, required to pull the tape from the panel surface at an angle of 180° and a stripping speed of 30 cm/sec divided by the force in grams required to pull a virgin tape that has not been contacted with a release-coated substrate from the panel times one hundred (expressed as a percentage).

Objects and advantages of this invention are further illustrated by the following examples, but the particular materials and amounts thereof recited in these examples, as well as other conditions and details, should not be construed to unduly limit this invention. In the following examples, unless indicated otherwise, parts and percentages are parts and percentages by weight and temperatures are in degrees centigrade.

EXAMPLE 1

A supported initiator in accordance with a preferred embodiment of the invention was prepared by dissolving 1 part of triphenylsulfonium hexafluoroantimonate in a mixture of 25 parts of methylene chloride and 10 parts of ethanol and adding 1 part of fumed silica (Cab-O-Sil TM M5). The mixture was stirred for 15 minutes, the solvent was evaporated, and air dried overnight at about 25° C. The residue (photoinitiator) was pulverized to provide a free flowing powder.

In the following examples, supported initiators having other photocatalytic ionic salts and other ratios of photocatalytic ionic salts to dispersible particulate carrier were prepared by the same procedure described above.

EXAMPLE 2

Utility of the supported initiators of the invention is illustrated by preparing release liners for pressure-sensitive adhesives as follows. Solventless actinic radiation-curable compositions of the invention, prepared to contain 7 parts by weight of composite photoinitiator of one part triphenylsulfonium hexafluoroantimonate to one part of fumed silica, as described in Example 1, were stirred into 93 parts of various epoxypolysiloxanes having the formula:

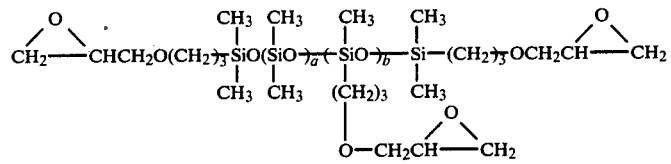

in which a is a number having a value of 20.7 to 88.2 and b is a number having a value of 0.6 to 9.8 as shown in TABLE I. The compositions were then handspread at a thickness of about 10 micrometers onto polypropylene film and exposed to radiation from a 200 watt medium pressure mercury lamp at a distance of 5 cm for two seconds as shown in TABLE I.

TABLE I

| Sample no. | Epoxy polysiloxane a | b | Release value before aging (g/2.5 cm) | after aging (g/2.5 cm) | Readhesion efficiency (%) |
| --- | --- | --- | --- | --- | --- |
| 1 | 20.7 | 2.3 | 456 | 840 | 82 |
| 2 | 22.4 | 0.6 | 239 | 520 | 93 |
| 3 | 43.2 | 4.8 | 351 | 391 | 92 |
| 4 | 45.6 | 2.4 | 226 | 349 | 93 |
| 5 | 46.4 | 1.6 | 149 | 388 | 97 |
| 6 | 46.8 | 1.2 | 101 | 231 | 86 |
| 7 | 88.2 | 9.8 | 279 | 577 | 93 |

When Example 2 was repeated using supported initiator concentrations of 6, 4, 2 and 1 weight percent, similar release values and readhesion efficiencies were obtained. Exposure times under radiation from a 200 watt lamp, however were increased to 10 seconds.

The data of TABLE I show that epoxypolysiloxanes having a molecular weight of about 2150 (Sample No. 2) to 8600 (Sample No. 7) and epoxide equivalent weights of 546 (Sample No. 1) to 1225 (Sample No. 6) are effectively cured by 7 weight percent of a 50:50 supported initiator on exposure to ultraviolet radiation for two seconds.

When EXAMPLE 2 was repeated using as initiator an equivalent amount of triphenylsulfonium hexafluoroantimonate without a carrier, efficient cure of the epoxy siloxane did not take place and the readhesion efficiency found was less than about 25 percent.

EXAMPLE 3

The procedure of Example 2, Sample 7 was repeated using in place of the epoxypolysiloxane in which a was 88.2 and b was 9.8, a mixture of such an epoxypolysiloxane and in sample numbers 8, 9, 10, and 11 respectively 33⅓%, 50%, 66⅔% and 100% of an epoxypolysiloxane as shown by the formula in Example 2 in which 25% of the Si(CH$_3$)$_2$O units were replaced by Si(C$_6$H$_5$)(CH$_3$)O units. The release values and readhesion efficiency of the release liners obtained are shown in TABLE II.

TABLE II

| Sample no. | %-Phenyl polysiloxane | Release value before aging (g/2.5 cm) | Release value after aging (g/2.5 cm) | Readhesion efficiency (%) |
|---|---|---|---|---|
| 8 | 33⅓ | 433 | 702 | 85 |
| 9 | 50 | 555 | 1104 | 82 |
| 10 | 66⅔ | 726 | 1291 | 77 |
| 11 | 100 | 1065 | 1799 | 75 |

The data of TABLE II show that mixtures of epoxypolysiloxanes having 25% phenylmethylsiloxy units are effectively cured by 7% of a 50:50 supported initiator on exposure to ultraviolet radiation for two seconds.

When the procedure of Example 3 was repeated using an equivalent amount of triphenylsulfonium hexafluoroantimonate but no carrier, efficient cure of the epoxypolysiloxane did not take place and the readhesion efficiency found was less than about 25%.

EXAMPLE 4

A series of supported initiators were prepared by the process described in Example 1 to contain one part of triphenylsulfonium hexafluoroantimonate and one part of the particulate carriers shown in TABLE III. Solventless compositions were prepared to contain 7 parts of the supported initiator and 93 parts of the epoxypolysiloxane as was used in Example 2, Sample 7. Each composition was then handspread at a thickness of about 10. micrometers onto polypropylene film and exposed to 8 passes through a PPG Processor (PPG Industries, Pittsburgh, Pa.) having four 200 watt medium pressure mercury lamps at a rate of 5 meters per second. Effectiveness of cure of each sample was evaluated by laminating a strip of pressure-sensitive tape to each surface (Opaque Box Sealing Tape, 3M Company, St. Paul, Minn., was used), peeling the tape from the exposed surface, folding the tape (adhesive surface to adhesive surface) and pressing together, and then pulling the contacted surfaces apart. Samples where the surfaces came apart easily with no transfer of adhesive material were given a zero to indicate that the adhesive tape had picked up uncured epoxypolysiloxane from the exposed sample, i.e. little, if any cure had taken place. Samples where the surfaces came apart with difficulty and more than 75% of the adhesive was pulled from the backing of the tape were given a 4 to indicate that little, if any uncured epoxypolysiloxane had been picked up by the adhesive tape, i.e. essentially complete cure of the epoxypolysiloxane had taken place. A 3 indicates more than 50% of the adhesive was pulled from the tape backing, i.e. very little uncured epoxypolysiloxane was present. A 2 incidates that some of the adhesive was pulled from the tape backing, i.e. epoxypolysiloxane had been cured but some uncured epoxypolysiloxane remained.

TABLE III

| Sample no. | Carrier | Dispersed | Particle size (micrometers) | Cure (a) |
|---|---|---|---|---|
| 12 | cellulose | yes | 2–15 | 4 |
| 13 | fumed silica | yes | 2–5 | 4 |
| 14 | TiO$_2$[b] | no | 3–5 | 0 |

TABLE III-continued

| Sample no. | Carrier | Dispersed | Particle size (micrometers) | Cure (a) |
|---|---|---|---|---|
| 15 | Al$_2$)$_3$[b] | no | 2–3 | 0 |
| 16 | ZrO$_2$[b] | no | 2–6 | 0 |
| 17 | bentonite clay | yes | 3–20 | 2 |
| 18 | glass bubbles | yes | 5–15 | 3 |
| 19 | graphite | yes | | 0 |

[a]4 is excellent cure, 3 is good cure, 2 is fair cure, 1 is poor cure, and 0 is no cure
[b]did not disperse in epoxypolysiloxane but settled out in less than 30 minutes The data of Table III show that samples made to contain 7% by weight of a supported initiator of an onium salt-carrier in which the carrier did not disperse in the epoxypolysiloxane did not activate polymerization of epoxypolysiloxane (Samples 14, 15, 16); nor did sample 19 in which the carrier was graphite because it did not transmit radiation. Samples in which the carrier was transparent to radiation and dispersed, however, did activate polymerization.

EXAMPLE 5

The procedure of Example 2, Sample 7 was repeated using as initiator seven parts of a supported initiator of one part of fumed silica to one part of the ionic salt of an onium or organometallic complex cation with a halogen containing complex anion of a metal or metalloid shown in TABLE IV that had been prepared as described in Example 1. The handspreads obtained were cured by exposure to 2, 4 and 8 passes through a PPG Processor as described in Example 4 and the cure of each determined as described in Example 4. The results obtained are given in TABLE IV.

TABLE IV

| Sample no. | Supported initiator[c] | Degree of cure[d] 2 passes[e] | 4 passes[e] | 8 passes[e] |
|---|---|---|---|---|
| 20 | triphenylsulfonium hexafluorophosphate | 1 | 1 | 2 |
| 21 | triphenylsulfonium hexafluoroarsenate | 2 | 2 | 3 |
| 22 | 4-hydroxyphenyl-diphenyl sulfonium hexafluoroantimonate | 2 | 3 | 4 |
| 23 | 4-mercaptophenyl diphenylsulfonium hexafluoroantimonate | 2 | 3 | 4 |
| 24 | 4-dodecylphenyl diphenylsulfonium hexafluoroantimonate | 3 | 4 | 4 |
| 25 | diphenyliodonium hexafluoroantimonate | 3 | 4 | 4 |
| 26 | 4-dodecylphenyl phenyliodonium hexafluoroantimonate | 3 | 4 | 4 |
| 27 | 4-dodecylphenyl phenyliodonium hexafluoroarsonete | 3 | 4 | 4 |
| 28 | 4-dodecylphenyl phenyliodonium hexafluorophosphate | 1 | 1 | 1 |
| 29 | bis($^6$-mesitylene)iron(2+) bis(hexafluoroantimonate) | 2 | 3 | 4 |

[c]fifty percent on fumed silica
[d]degree of cure as disclosed in Example 4
[e]passes through a PPG Processor having four 200 watt medium pressure lamps at 4 meters per second.

The data of TABLE IV show that various ionic salts of an onium or organometallic complex cations with a halogen containing complex anion of a metal or metalloid were effective for curing epoxypolysiloxane.

Various modifications and alterations of this invention will become apparent to those skilled in the art without departing from the scope and spirit of this invention, and it should be understood that this invention is not to be unduly limited to the illustrative embodiments set forth herein.

I claim:

1. A supported initiator for the radiation activated polymerization of a cationically-polymerizable compound in the absence of a nonreactive solvent comprising a dispersible particulate carrier less than 50 micrometers in its largest dimension carrying and supporting a photocatalytic ionic salt of an onium or an organometallic complex cation with a halogen-containing complex anion of a metal or metalloid to form a composite initiator of said ionic salt and carrier, said initiator being insoluble in said cationically-polymerizable compound, and when 10 parts by weight of said initiator are stirred into 90 parts by weight of an epoxypolysiloxane no more than 1 part by weight of said initiator settles out in 30 minutes.

2. The supported initiator of claim 1 wherein when 10 parts by weight of said particulate carrier are stirred into 90 parts by weight of an epoxypolysiloxane no more than 1 part by weight of the particulate carrier settles out of the epoxypolysiloxane in 30 minutes.

3. The supported initiator of claim 1 wherein said carrier is silica, diatomaceous earth, cellulose, clay, glass, or starch.

4. The supported initiator of claim 1 wherein said carrier is silica.

5. The supported initiator of claim 1 comprising 0.005 to 5 parts by weight of said ionic salt per part by weight of particulate carrier.

6. The supported initiator of claim 1 wherein said onium cation of said ionic salt is an aromatic organoatomic cation of a Periodic Group VA, VIA, or VIIA atom.

7. The supported initiator of claim 1 wherein said onium cation is an aromatic cation of phosphorous, antimony, nitrogen, sulfur, or iodine.

8. The supported initiator of claim 1 wherein said onium cation is an aromatic cation of sulfur or iodine.

9. The supported initiator of claim 1 wherein the ionic salt has the formula

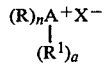

wherein

R is an aromatic group at least as electron withdrawing as benzene;

$R^1$ is an aromatic group that is the same as or different from R or is a straight, branched, or cyclic alkyl or alkenyl group having 1 to 18 carbon atoms;

A is an atom of the Periodic Group VA, VIA, or VIIA;

a is zero or a positive integer of up to the valence of A;

n is a positive integer of at least 1 up to the valence of A plus 1, provided that the sum of a plus n being equal to the valence of A plus 1; and X is a halogen-containing complex anion of a metal or metalloid.

10. The supported initiator of claim 1 wherein the ionic salt is selected from triphenylsulfonium hexafluoroantimonate, triphenylsulfonium hexafluorophosphate, diphenyliodonium hexafluoroantimonate, and diphenyliodonium hexafluorophosphate.

11. The supported initiator of claim 1 wherein the photocatalytic ionic salt has an organometallic complex cation and a halogen-containing complex anion of a metal or metalloid in which said cation is capable of adding an intermediate strength nuclophile and the metal of said cation is selected from elements of Periodic Groups IVB, VB, VIB, VII, VIIB, and VIIIB.

12. The supported initiator of claim 8 in which the ionic salt has the formula

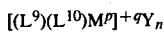

wherein $M^p$ represents a metal selected from Cr, Mo, W, Mn, Re, Fe, and Co;

$L^9$ represents 1 or 2 ligands contributing $\pi$-electrons that can be the same or different ligand selected from substituted and unsubstituted $\eta^3$-allyl, $\eta^5$-cyclopentadienyl, and $\eta^7$-cycloheptatrienyl and $\eta^5$-aromatic compounds selected from the group consisting of $\eta^6$-benzene and substituted $\eta^6$-benzene compounds and compounds having 2 to 4 fused rings each capable of contributing 3 to 8 $\pi$-electrons to the valence shell of $M^p$;

$L^{10}$ represents none or 1 to 3 ligands contributing an even number of $\sigma$-electrons that can be the same or different ligand selected form carbon monoxide or nitrosonium;

with the proviso that the total electronic charge contributed to $M^p$ by $L^9$ or $L^{10}$ plus the ionic charge on metal $M^p$ results in a net residual positive charge of q to the complex, and q is an integer having a value of 1 or 2, the residual electrical charge of the complex cation;

Y is a halogen-containing complex anion selected from $AsF_6^-$, $SbF_6^-$ and $SbF_5OH^-$; and n is an integer having a value of 1 or 2, the number of complex anions required to neutralize the charge q on the complex cation.

13. The supported initiator of claim 9 wherein the ionic salt is selected from ($\eta^5$-cyclopentadienyl)tricarbonyliron(1+) hexafluorophosphate, ($\eta^5$-cyclopentadienyl)tricarbonyliron(1+) hexafluoroantimonate, bis($\eta^5$-cyclopentadienyl)iron(1+) hexafluoroantimonate, bis($\eta^5$-cyclopentadienyl)iron(1+) hexafluorophosphate, bis($\eta^6$-benzene)chromium(1+) hexafluoroantimonate, and bis($\eta^6$-mesitylene)iron(2+) bis(hexafluoroantimonate).

14. An actinic radiation-curable composition comprising a cationically-polymerizable compound and a radiation-activated supported initiator in the absence of a nonreactive solvent comprising one part of a dispersible particulate carrier less than 50 micrometers in its largest dimension having a surface area of from about 1 to 1000 square meters per gram and carrying and supporting 0.005 to 5 parts by weight of a photocatalytic ionic salt of an onium or organometallic complex cation with a halogen containing complex anion of a metal or metalloid to form a composite initiator of said ionic salt and carrier, said initiator being insoluble in said cationically-polymerizable compound, and when 10 parts by weight of said initiator are stirred into 90 parts by weight of an epoxypolysiloxane no more than 1 part by weight of said initiator settles out in 30 minutes.

15. The composition according to claim 14 wherein said cationically-polymerizable compound is a polymerizable epoxide group-containing compound.

16. The composition according to claim 14 wherein said cationically-polymerizable compound is a vinyl ether.

17. The composition of claim 14 wherein said cationically-polymerizable compound is an organopolysiloxane having the formula

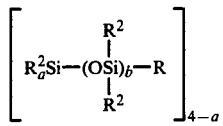

wherein
each $R^2$ is independently a monovalent organic group having up to 18 carbon atoms, 37 hydrogen atoms, and 3 oxygen atoms, or $R^3$, at least one of $R^2$ being $R^3$ in which $R^3$ is a monovalent epoxy group-substituted or a vinyloxy group- substituted hydrocarbyl group,
a is zero, one, two or three; and
b is a number having an average value from 2 to about 1000 such that when considered with the value of a provides a number average molecular weight to the epoxy group-containing organopolysiloxane between 500 and 100,000.

18. The composition according to claim 14 wherein said supported initiator comprises an onion catalyst having the formula

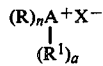

wherein
R is an aromatic group at least as electron withdrawing as benzene;
$R^1$ is an aromatic group that is the same as or different from R or is a straight, branched, or cyclic alkyl or alkenyl group having 1 to 18 carbon atoms;
A is an atom of the Periodic Group VA, VIA, or VIIA;
a is zero or a positive integer of up to the valence of A;
n is a positive integer of at least 1 up to the valance of A plus 1, the sum of a plus n being equal to the valance of A plus 1; and
X is a halogen-containing complex anion of a metal or metalloid.

19. The composition according to claim 14 wherein said supported initiator comprises an ionic salt having an organometallic complex cation and a halogen containing complex anion of a metal or metalloid in which said cation is capable of adding an intermediate strength nuclophile and the metal of said cation is selected form elements of Periodic Groups IVB, VB, VIB, VII, VIIB, and VIIIB.

20. The composition according to claim 14 wherein in the range of 0.05 to 20 parts of supported photoinitiator is present per part of cationically-polymerizable compound.

21. The composition according to claim 17 wherein said ionic salt has the formula

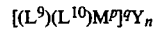

wherein $M^p$ represents a metal selected from Cr, Mo, W, Mn, Re, Fe, and Co;
$L^9$ represents 1 or 2 ligands contributing $\pi$-electrons that can be the same or different ligand selected from substituted and unsubstituted $\eta^3$-allyl, $\eta^5$-cyclopentadienyl, and $\eta^7$-cycloheptatrienyl and $\eta^6$-aromatic compounds selected from $\eta^6$-benzene and substituted $\eta^6$-benzene compounds and compounds having 2 to 4 fused rings each capable of contributing 3 to 8 $\pi$-electrons to the valence shell of $M^p$;
$L^{10}$ represents none or 1 to 3 ligands contributing an even number of $\sigma$-electrons that can be the same or different ligand selected from carbon monoxide or nitrosonium; with the proviso that the total electronic charge contributed to $M^p$ by $L^9$ and $L^{10}$ plus the ionic charge on metal $M^p$ results in a net residual positive charge of q to the complex, and
q is an integer having a value of 1 or 2, the residual electrical charge of the complex cation;
Y is a halogen-containing complex anion selected from $AsF_6^-$, $SbF_6^-$ and $SbF_5OH^-$; and
n is an integer having a value of 1 or 2, the number of complex anions required to neutralize the charge q on the complex cation.

22. An article comprising a substrate bearing on at least one surface thereof a cured coating of a composition comprising
(a) an actinic radiation-curable composition comprising a cationically-polymerizable compound in the absence of a nonreactive solvent, and
(b) a radiation-activated supported initiator comprising one part of a dispersible particulate carrier less than 50 micrometers in its largest dimension having a surface area of from about 1 to 1000 square meters per gram carrying and supporting 0.005 to 5 parts by weight of a photocatalytic ionic salt of an onium or organometallic complex cation with a halogen containing complex anion of a metal or metalloid to form a composite initiator of said ionic salt and carrier, said initiator being insoluble in said cationically-polymerizable compound, and when 10 parts by weight of said initiator are stirred into 90 parts by weight of an epoxypolysiloxane no more than 1 part by weight of said initiator settles out in 30 minutes.

23. The article according to claim 22 wherein said cationically-polymerizable compound is a polymerizable epoxide group-containing. compound and said supported initiator comprises an onium catalyst having the formula

wherein
R is an aromatic group at least as electron withdrawing as benzene;
$R^1$ is an aromatic group that is the same as or different from R or is a straight, branched, or cyclic alkyl or alkenyl group having 1 to 18 carbon atoms;
A is an atom of the Periodic Group VA, VIA, or VIIA;
a is zero or a positive integer of up to the valence of A;

n is a positive integer of at least 1 up to the valence of A plus 1, the sum of a plus n being equal to the valence of A plus 1; and X is a halogen-containing complex anion of a metal or metalloid or an ionic salt having an organometallic complex cation and a halogen containing complex anion of a metal or metalloid in which said cation is capable of adding an intermediate strength nuclophile and the metal of said cation is selected from elements of Periodic Groups IVB, VB, VIB, VII, VIIB, and VIIIB.

24. A process comprising
(a) providing at least one cationically-sensitive compound;
(b) dispersing in said compound a supported initiator in the absence of a nonreactive solvent, said initiator comprising a dispersible particulate carrier less than 50 micrometers in its largest dimension and carrying and supporting a photocatalytic ionic salt of an onium or an organometallic complex anion of a metal or metalloid to form a composite initiator of said ionic salt and carrier, said initiator being insoluble in said cationically-polymerizable compound, and when 10 parts by weight of said initiator are stirred into 90 parts by weight of an epoxypolysiloxane no more than 1 part by weight of said initiator settles out in 30 minutes, and
(c) allowing a source of actinic radiation to contact the resulting dispersion for a time sufficient to polymerize said compound.

* * * * *